(12) United States Patent
Hahn et al.

(10) Patent No.: US 6,263,478 B1
(45) Date of Patent: Jul. 17, 2001

(54) SYSTEM AND METHOD FOR GENERATING AND USING STAGE-BASED CONSTRAINTS FOR TIMING-DRIVEN DESIGN

(75) Inventors: Mark S. Hahn, Milpitas; Jimmy Lam; Limin He, both of Cupertino; Chris Morrison, Sunnyvale, all of CA (US)

(73) Assignee: Cadence Design Systems, Inc., San Jose, CA (US)

( * ) Notice: Subject to any disclaimer, the term of this patent is extended or adjusted under 35 U.S.C. 154(b) by 0 days.

(21) Appl. No.: 09/132,381

(22) Filed: Aug. 11, 1998

Related U.S. Application Data

(60) Provisional application No. 60/055,581, filed on Aug. 12, 1997.

(51) Int. Cl.$^7$ ............................. G06F 15/00
(52) U.S. Cl. ............................. 716/10; 716/6
(58) Field of Search ............................. 716/6, 10

(56) References Cited

U.S. PATENT DOCUMENTS

| | | | |
|---|---|---|---|
| 5,095,454 | 3/1992 | Huang | 364/578 |
| 5,251,147 | 10/1993 | Finnerty | 364/490 |
| 5,452,239 | 9/1995 | Dai et al. | 364/578 |
| 5,550,748 | 8/1996 | Xiong | 364/488 |
| 5,650,938 | 7/1997 | Bootehsaz et al. | 364/490 |
| 5,778,216 | * 7/1998 | Venkatesh | 716/6 |
| 5,825,658 | 10/1998 | Ginetti et al. | 364/488 |

OTHER PUBLICATIONS

Hauge, Peter S., Nair, Ravi, Yoffa, Ellen J., "Circuit Placement for Predictable Performance", Digest of Technical Papers, pp. 88–91, IEEE International Conference on Computer–Aided Design ICCAD–87, Nov. 9–12, 1987, Santa Clara, California.

Cadence Design Systems, Inc., "General Constraints Format Specification", Version 1.2, Aug. 22, 1997, San Jose, California.

Frankle, Jon, "Iterative and Adaptive Slack Allocation for Performance–Driven Layout and FPGA Routing" Paper 34.1, pp. 536–542, 29$^{th}$ ACM/IEEE Design Automation Conference Proceedings 1992, Jun. 8–12, 1992, Anaheim, California.

Hitchcock Sr., Robert B., Smith, Gordon L., Cheng, David D., "Timing Analysis of Computer Hardware", IBM J. Res. Develop., vol. 26, No. 1, pp. 100–105, Jan. 1982, Endicott, New York.

McWilliams, Thomas M., "Verification of Timing Constraints on Large Digital Systems", pp. 139–147, 17$^{th}$ Design Automation Conference Proceedings, Jun. 23–25, 1980, Minneapolis Minnesota.

Youssef, Habib, Shragowitz, Eugene, "Timing Constraints for Correct Performance", Digest of Technical Papers, pp. 24–27, IEEE International Conference on Computer–Aided Design ICCAD–90, Nov. 11–15, 1990, Santa Clara, California.

* cited by examiner

*Primary Examiner*—Matthew Smith
*Assistant Examiner*—Thuan Do
(74) *Attorney, Agent, or Firm*—Lyon & Lyon LLP

(57) ABSTRACT

An integrated circuit design is divided into partitions which each contain two stages of information. The first stage corresponds to sources within the design, and the second stage corresponds to targets within the design. In one implementation, all of the sources in each partition are triggered by a common clock edge. In another implementation, all targets of each partition are triggered by a common clock edge. Specifying timing constraints in partitions can provide an efficient method of determining how much slack, if any, is present in the timing of a design.

50 Claims, 5 Drawing Sheets

SYSTEM AND METHOD FOR GENERATING AND USING STAGE-BASED CONSTRAINTS FOR TIMING-DRIVEN DESIGN

CLAIM OF BENEFIT FROM RELATED APPLICATION

This application hereby claims the benefit of commonly assigned provisional application with Ser. No. 60/055,581, titled "System and Method for Generating and Using Stage-based Constraints for Timing-Driven Design", which was filed on Aug. 12, 1997, and which is incorporated herein in its entirety by reference.

FIELD OF INVENTION

This invention pertains to the fields of generating and using constraints for timing-driven design of integrated circuits. More particularly, this invention relates to the generation and use of stage-based constraints for timing-driven design of integrated circuits.

BACKGROUND OF INVENTION

Traditional methods for specifying the timing constraints on an integrated circuit design fall into two categories: system level constraints entered by the user, and detailed path constraints generated automatically from the system level constraints. System level constraints are very compact and provide full coverage of the timing constraints on the entire design, but they require complicated timing analysis techniques to interpret accurately. Detailed path constraints are straightforward to interpret, and have therefore been used extensively in timing-driven placement and routing tools. However, the number of detailed path constraints required to provide reasonable coverage makes this approach unsuitable for very large designs. To address this problem, this invention defines a new formulation of timing constraints, which provides a compact representation with no loss of the information in system level constraints, yet is simple and efficient to interpret. Mechanisms for automatically generating these stage-based constraints are described, along with the use of the constraints for timing-driven placement, timing-driven routing, and incremental logic optimization.

As circuit density increases, deep-submicron effects on the ratio between interconnect delay and gate delays become increasingly important. These effects make it necessary to perform timing-driven placement, physically-based incremental logic optimization, and timing-driven routing.

Although existing techniques for passing timing constraints to placement and routing are well-established, we expect that in the near future these techniques will reach their limits in performance and capacity. As designs of more than a million gates become common-place, the traditional approach based on detailed path constraints will run into problems with the amount of time required to generate the constraints, the file size needed to pass them from tool to tool, and the memory usage and CPU time required to interpret them.

Worse, each of the existing techniques for generating detailed path constraints suffers from a lack of coverage. Some paths in the design go unconstrained, often because the number of path constraints is restricted to reduce their size, but also because the mechanisms for selecting the paths do not ensure that every path in the design is covered. One popular path selection technique, used in the Synopsys Design Compiler "cover_design" method of generating detailed path constraints, still suffers from a coverage problem for paths through reconvergent logic.

Because of this lack of coverage, detailed path constraints are not suitable for driving incremental logic optimization.

SUMMARY OF THE INVENTION

An integrated circuit design is divided into partitions which each contain two stages of information. The first stage corresponds to sources within the design, and the second stage corresponds to targets within the design. A source is associated with an arrival time of a specific clock edge which triggers that source. A target is associated with a required departure time for a specific clock edge which triggers that target. In one implementation, all of the sources in each partition are triggered by a common clock edge. In another implementation, all of the targets in each partition are triggered by a common clock edge. Both of these implementations includes two sub-implementations. For the implementation in which all sources are triggered by a common clock edge, there is one sub-implementation in which all targets in each partition are also triggered by a common clock edge, and another sub-implementation in which this is not true. Similarly, for the implementation in which all targets are triggered by a common clock edge, there is one sub-implementation in which all sources in each partition are also triggered by a common clock edge, and another sub-implementation in which this is not true. The partitions can be used to determine how much slack, if any, is present in a design.

Each partition groups together paths which share a similar cycle accounting. By minimizing the amount of information in each partition, a timing analysis which covers all possible paths is possible for a large design without requiring enormous amounts of storage for constraint files.

DETAILED DESCRIPTION OF A PREFERRED EMBODIMENT

Figure 1:
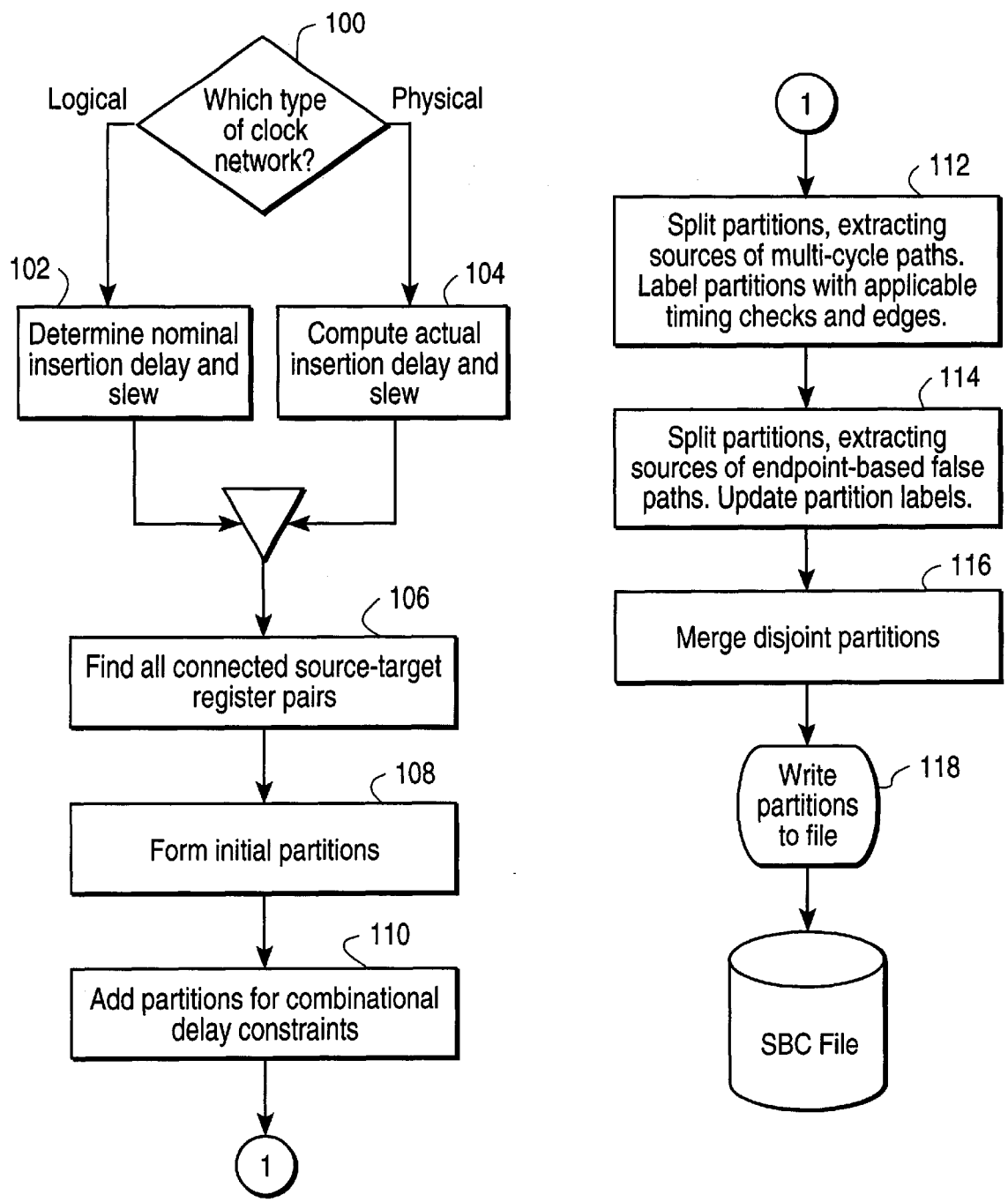
FIG. 1 is a flowchart illustrating the stage-based constraint generation process according to a preferred embodiment of the present invention.

Some of the differences and advantages of the present invention are now set forth. A compact and accurate form of the timing constraints is the system level constraints entered by the designer, which include arrival/departure times, clock waveforms, false and multi-cycle specifications, and boundary conditions. All of this information is required in order to provide complete coverage of the constraints on the design.

However, interpreting these constraints directly requires full-blown timing analysis, which is complicated by the fact that the delay constraint on each path depends on the relationship between the clock waveforms at the source and target, as well as the setup and hold times of the target.

Clock waveforms are usually specified at the root of a clock distribution network. The position of the edges in each waveform are set to reflect offsets from a common implicit reference point, which provides a consistent frame of reference for calculations which relate clock waveforms.

Cycle accounting is the process for determining which root edges of the clock waveforms trigger the source and target elements. In general, it is not possible to determine which edge of a source clock waveform should be considered without also knowing the target clock waveform. This is particularly true for clocking schemes with multiple phases and frequencies, and for cases where multi-cycle paths are used.

The fundamental problem that this presents is that at an intermediate point in the circuit, the arrival times of signal transitions from multiple sources cannot be directly compared. Each arrival time is interpreted as an offset from a source clock edge (the offset is the propagation delay from the source to the intermediate point), but which source clock edge should be used depends on what the targets are.

Unfortunately, efficient timing analysis algorithms depend on being able to compare arrival times from multiple sources. In a general purpose timing analysis tool like Pearl which is commercially available from Cadence Design Systems Inc., San Jose Calif., this issue is typically addressed by doing timing analysis separately for paths starting with each source clock edge, which requires the ability to trace from the root of a clock distribution network to each storage element.

Tracing through the clock network, handling false and multi-cycle paths, and doing the cycle accounting are relatively complicated tasks. Implementing support for them correctly and efficiently in each tool which needs to analyze timing constraints is a significant undertaking. For this reason, detailed path constraints commonly have been used as a derived form of timing constraints, where one tool implements the complicated support for system level constraints and translates them into a simpler form for use by other tools. Detailed path constraints consist of a list of path descriptions, where each path description gives the individual pins along the path and the constraint on the delay required for a signal transition to propagate through the entire path.

An alternate technique which also uses one tool to translate system level constraints into a simpler form for use by other tools is called 3-pin constraints. This technique, unlike detailed path constraints, provides complete coverage of the timing constraints on a design. With 3-pin constraints, one constraint is given for each source-target connection, describing only the clock input and data output pins on the source and the data input pin on the target. 3-pin constraints can be viewed as a degenerate form of stage-based constraints.

Stage-based constraints differ from system level constraints in that they explicitly represent the set of source-target pairs which should be considered. The arrival times of the clock edges at the sources and targets are adjusted to reflect the effects of clock skew and proper cycle accounting.

Stage-based constraints differ from detailed path constraints in that they do not explicitly describe all of the pins along the paths which are constrained. Instead, only the endpoints of the paths are given.

Stage-based constraints differ from 3-pin constraints in that individual source-target pairs are merged together into groups, where all of the source-target pairs within a group have similar cycle accounting.

The following items are incorporated by reference herein in their entirety. [1] T. M. McWilliams, "Verification of Timing constraints on large digital systems," in Proceedings of the 17th ACM/IEEE Design Automation Conference, (Minneapolis), pp. 139–147, ACM/IEEE, June 1980. [2] R. B. Hitchcock, G. L. Smith, and D. D. Cheng, "Timing Analysis of Computer Hardware," IBM J. of Research and Development. 26, pp. 100–105, January 1982. [3] J. Frankle, "Iterative and Adaptive Slack Allocation for Performance-driven Layout and FPGA Routing," in Proceedings of the 29th ACM/IEEE Design Automation Conference, pp. 536–542, ACM/IEEEE, June 1992. [4] H. Youssef, and E. Shragowitz, "Timing Constraints for Correct Performance," in Proceedings of ICCAD '90, pp. 24–27, 1990. [5] P. Huage, R. Nair, and E. Yoffa, "Circuit placement for predictable performance," in Proceedings of ICCAD '87, pp. 88–91, 1987. [6] Pearl Users Guide, Version 3.2, pp. 5.20–5.29, 1996. [7] M. Hahn, General Constraint Format Specification, Version 1.0, pp. 77–84, 1997.

Stage-based constraints provide a complete and accurate representation of nearly all of the system level timing constraints in common use today, are relatively compact, and are very simple to interpret.

Compared with existing approaches for timing-driven placement, routing, and incremental logic optimization, stage-based constraints scale much better with design size and avoid the need to embed full timing analysis engines in every tool.

Relative to detailed path constraints, stage-based constraints: (1) provide complete coverage and preserve the full semantics of the system-level constraints; (2) are sufficient for driving incremental logic optimization; (3) result in much faster run times for timing-driven placement and routing; (4) have a significantly smaller file size; (5) require less memory to interpret; and (6) are much faster to generate.

Relative to system-level constraints, stage-based constraints are much easier to support in timing-driven placement and routing, and in incremental logic optimization.

Relative to 3-pin constraints, stage-based constraints result in much faster run times for timing-driven placement and routing, and for incremental logic optimization, and have a significantly smaller file size Stage-based constraints ensure consistency between tools by making it relatively easy to do consistent timing analysis.

They also provide consistency by explicitly incorporating clock slews and insertion delays (which then do not need to be recalculated in each tool with a likely loss in accuracy).

A feature of the present invention in the stage-based constraints formulation is to divide the circuit into a number of constraint partitions, where within each partition, all times are a known offset from a common reference point.

The constraint partitions are identified by a set of sources and a set of targets, and each partition includes all paths which start at one of the sources and end at one of the targets. The sources represent one stage, and the targets represent another stage. The partitions are disjoint and complete in the sets of paths they cover (every path appears in exactly one partition). However, they usually overlap in the sense that a particular gate will appear in multiple paths which are assigned to different partitions.

In the following discussion, primary bidirectional pins are treated as both primary inputs and primary outputs.

As used herein, source refers to either a sequential source or a combinational source. Similarly, target refers to either a sequential target or a combinational target. A sequential source is a construct comprising a clock edge arrival time and an arc from a clock pin to a data output pin on a sequential element, or a relative arrival time and a primary input. A sequential target is a construct comprising a clock edge arrival time and an arc from a data input pin to a clock pin on a sequential element, or a relative required time and a primary output. Sequential source and sequential target arcs are labeled with the trigger edge of the clock. When both edges trigger the sequential element, two arcs are used, and each arc will generally be in a different partition. A path is specified by a source and a target which are connected either by interconnect wiring, or a combination of interconnect wiring and combinational logic.

Using arcs for sequential sources and sequential targets is also important for handling complex macros, where there may be several different related clock pins associated with a given data input or output pin on the macro. Each related clock pin has a separate clock edge arrival time, which is associated with the arc.

The constraint on the propagation delay of each path is affected by the propagation delay of the clock from the clock root to each source. This effect is explicitly represented in the partitions by including a clock edge arrival time in the specification of each sequential source and of each sequential target. The clock edge arrival time includes both the original offset of the root clock edge from the implicit reference point and the propagation delay of that edge through the clock network.

Normally, the physical clock distribution network is created after initial placement of the rest of the circuit. When a clock network does not yet exist, the clock edge arrival times in the constraint partitions are computed using a nominal insertion delay. When the clock network does exist, delay calculation is performed on the clock network, and the clock edge arrival times reflect the computed insertion delays.

The propagation delay of each path is affected by the slew of the source clock. When a clock network does not yet exist, a default slew is assumed for each source clock. When the clock network does exist, the slew computed during delay calculation is specified as part of each partition.

Setup and hold times also affect the delay constraint on each path. These depend on both the slew of the data transition and the slew of the target clock. Because the slew of the data transition is sensitive to the types of the components in the path as well as their placement, setup and hold times are computed by the tool which expands the stage-based constraints.

Designers specify arrival times and departure times at primary inputs/outputs as offsets relative to a root clock edge. For each input, there may be multiple arrival times referenced to different root clock edges. Similarly, for each output, there may be multiple departure times referenced to different root clock edges.

Paths which start at a primary input or end at a primary output are included in constraint partitions by specifying the primary input as a sequential source or the primary output as a sequential target. When there are multiple arrival or departure times for a primary input/output, it will be included in several different partitions, one for each reference clock edge.

Within each partition, a relative arrival time is computed for each primary input. The relative arrival time reflects both the offset of the root clock edge from the implicit reference point and the user-specified offset from the root clock edge. Similarly, a relative required time is computed for each primary output. The relative required time reflects both the offset of the root clock edge from the implicit reference point and the user-specified offset from the root clock edge.

It is possible for a designer to specify an arrival time or departure time for only one edge (either rising or falling) of the data transition. In this case, the relative arrival or required time for the other edge is omitted from the constraint partition. A missing arrival or required time indicates that there is no constraint on the propagation delay of that edge through the paths in the partition which start or end at the corresponding primary input/output.

In some cases, designers specify explicit constraints on the combinational delays of a portion of the design (all combinational paths from a set of pins to another set of pins). A common case is for the connections between registers in different clock domains, where the clocks are asynchronous with respect to each other. A user may optionally specify an input delay on a combinational source pin or an output delay on a combinational target pin; these delays are subtracted from the nominal constraint on each path.

Combinational constraints are easily handled in the stage-based constraints formulation by defining additional partitions which include the combinational sources and combinational targets of the combinational constraints.

The semantics of partitions for combinational constraints are the same as for sequential constraints, with relative arrival times at the combinational sources and relative required times at the combinational targets instead of clock edge arrival times. The relative arrival time at combinational sources defaults to 0, and an input delay becomes a positive relative arrival time. The relative required time at combinational targets defaults to the specified nominal delay, and output delays are subtracted from the default.

There are two variations in how the partitions are formed. In the first variation, $SBC_1$, the partitions are formed such that within each partition, all sources are triggered by a common root clock edge, and all targets are triggered by another common root clock edge. In the second variation, $SBC_2$, all sources within a partition are triggered by a common clock edge, but the targets may be triggered by different clock edges.

Multi-cycle paths specified using the endpoints of the paths are handled by creating special partitions, where each partition contains a single source and all of the targets driven by that source which require the same number of cycles. Within each partition, the source or target clock edge arrival times are adjusted by the specified number of cycles, so that multi-cycle partitions are interpreted exactly the same as single cycle partitions. False paths specified using the endpoints of the paths are handled by omitting each pair of source-target endpoints from all partitions.

It is possible to specify that only one edge of the data transition at the target should be treated as multi-cycle or false. For these cases, new partitions are formed as needed, and each partition is labeled to indicate which edges at the target should be considered. The tools which interpret the stage-based constraints use these labels to suppress the associated timing checks. Each of the additional partitions is formed such that all paths have the same number of cycles for the specified edges.

It is also possible to specify that only one of the timing checks at the target (either setup or hold) should be affected by a multi-cycle or false path specification. This can be combined with the ability to specify that only one edge of the data transition is affected, so that, for example, a user can state that only the rising edge of the setup check is modified by a multi-cycle specification, or that only the falling edge of the setup check is to be treated as false (disabled).

As with specifications which affect only one edge of the data transition, specifications which affect only one of the timing checks are handled by forming new partitions as needed, so that within a given partition, all paths to a given target have the same timing checks enabled for the same edges of the data transition, and each of those timing checks is with respect to the same number of cycles. Each partition is labeled to indicate, for each target, which timing checks and which edges of those timing checks, along with the edge of those timing checks. The arrival times of the clock edges at each target are adjusted to account for the appropriate number of cycles.

Designers also eliminate false paths from consideration by disabling a single pin or a timing arc, so that all paths which pass through the pin or arc are ignored. These specifications can be included with the stage-based constraints, or can be stored separately. The false path specifications are interpreted during the expansion of each constraint partition.

FIG. 1 is a flowchart illustrating the stage-based constraint generation process according to a preferred embodiment of the present invention.

First, the type of clock network (either logical or physical) is determined 100. For each physical clock distribution network, perform delay calculation and compute the insertion delay and slew for each leaf clock pin (clock input pins on sequential elements) 104. For each logical clock distribution network, determine the default insertion delay and slew for each leaf clock pin 102.

Next, perform a depth-first search forward from each source clock root to find all connected source-target pairs 106. Form an initial set of partitions from the source-target pairs 108. Within each partition, each source is connected to at least one target in the partition, and each target is connected to at least one source in the partition.

For $SBC_1$, there is one initial partition for each combination of source and target root clock edges. All of the sources are sequential sources. These correspond to either primary input pins or clock-to-data output arcs triggered by a common root clock edge. All of the targets are sequential targets. These targets correspond to either primary outputs pins or data input-to-clock arcs triggered by another common root clock edge.

For $SBC_2$, there is one initial partition for each source root clock edge. All of the sources are sequential sources. These correspond to either primary input pins or clock-to-data output arcs triggered by that clock edge. All of the targets are sequential targets. These targets correspond to either primary output pins or data input-to-clock arcs.

After forming initial partitions, add a partition for each explicit combinational delay constraint 110. Then, for each endpoint-based multi-cycle path specification, extract the sources identified by the specification from the existing partitions to form new partitions, where each new partition contains one source and all of the targets of that source which require the same number of cycles 112. For multi-cycle path specifications which only affect one of the timing checks (either setup or hold, but not both), or which only affect one edge of the data transition at the target for the timing check(s), create new partitions as necessary to ensure that, for each of the targets in each partition, all of the paths in the partition to that target have the same timing checks enabled for the same edges of the data transitions, and each of those timing checks is with respect to the same number of cycles.

If the multi-cycle specification only applies to one edge or to one of the timing checks, label the partitions accordingly.

Next, for each endpoint-based false path specification, extract the sources of these specifications from existing partitions to form new partitions, where each new partition contains one source and all of the non-false targets of that source with the same number of cycles, and the same set of timing checks and edges are enabled for the paths in each partition 114.

If the false path specification only applies to one edge or timing check, there are three cases:
1. If the existing partition is not labeled then one new unlabeled partition should be formed containing the source and all of the non-false targets, and a second partition should be formed containing the false targets. The second partition should be labeled as applying only to the non-false edge or timing check.
2. If the existing partition is labeled as applying only to the false edge or timing check then the false targets should be deleted from the existing partition.
3. If the existing partition is labeled as applying only to the non-false edge or timing check then nothing needs to be done, because the false edge has already been screened out.

After managing the false paths, combine disjoint partitions which have the same source root clock edge (and target clock edge, for $SBC_1$) 116. By disjoint, we mean that there is no source-target pair from a source in one of the partitions to a target in the other partition.

Merging disjoint partitions can substantially reduce the number of partitions while preserving the semantics.

Finally, write out the description of each partition and the arc and pin disables 118.

Timing-Driven Placement and Routing

QPlace and WARP router, which are both commercially available from Cadence Design Systems, Inc., San Jose, Calif., support timing-driving placement and routing based on stage-based constraints. The mechanisms for interpreting the stage-based constraints are the same for both programs, but they are invoked at different points in the processing.

For QPlace, the placement is successively refined in a number of iterations, where each iteration results in a better estimation of the placement for each component. Stage-based constraints are interpreted at the start of each iteration in order to determine a timing weight for each net. Nets with higher timing weights are more likely to have their associated components placed close together.

For the Warp router, stage-based constraints are interpreted in order to determine a timing weight for each net. Nets with higher timing weights are routed before nets with lower timing weights and may be routed on preferred layers with better delay characteristics due to smaller parasitic values.

Figure 2A:
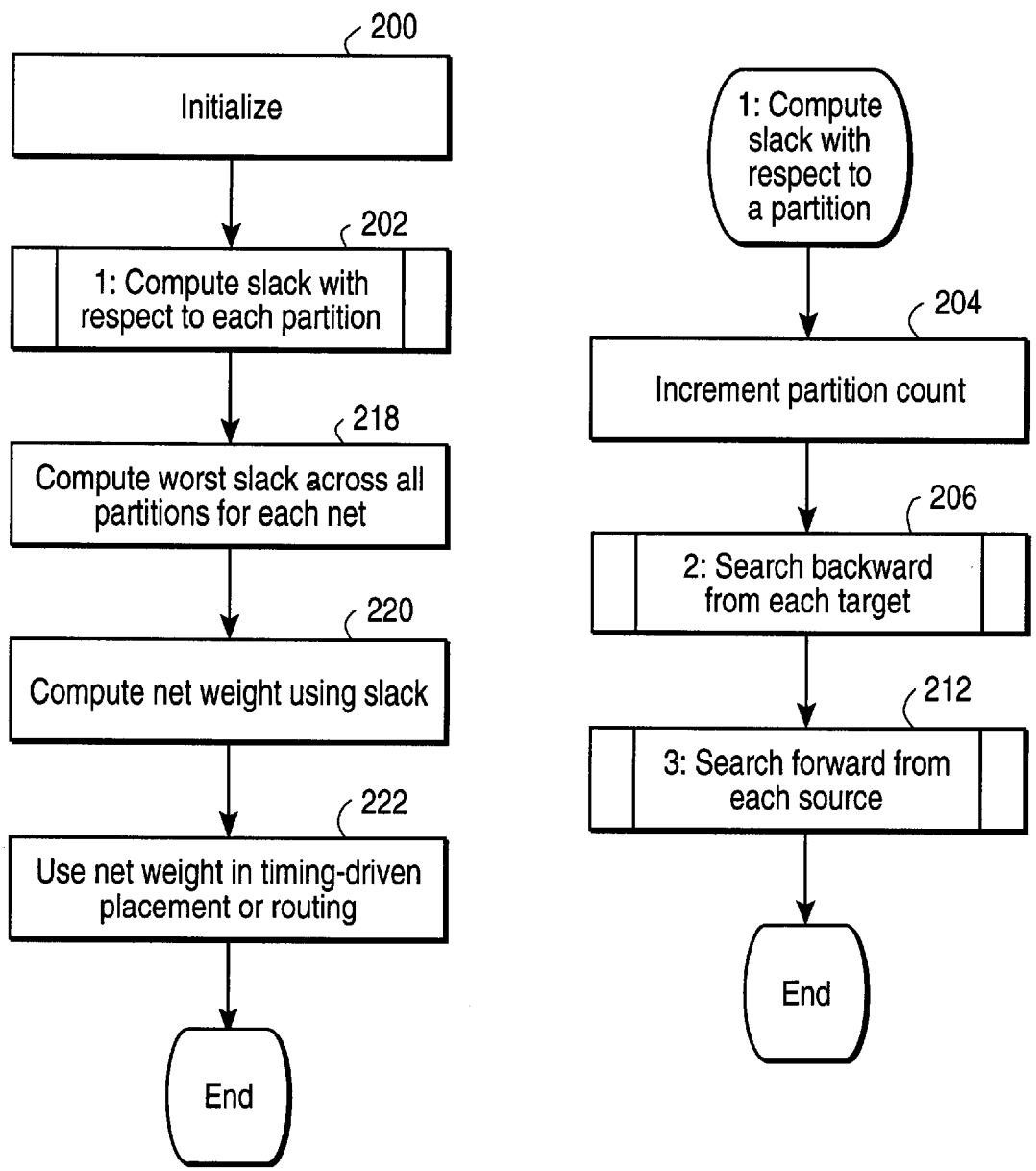
FIGS. 2(a)–(b) are flowcharts illustrating the use of stage-based constraints for timing-driven placement and routing according to a preferred embodiment of the present invention.
Figure 2B:
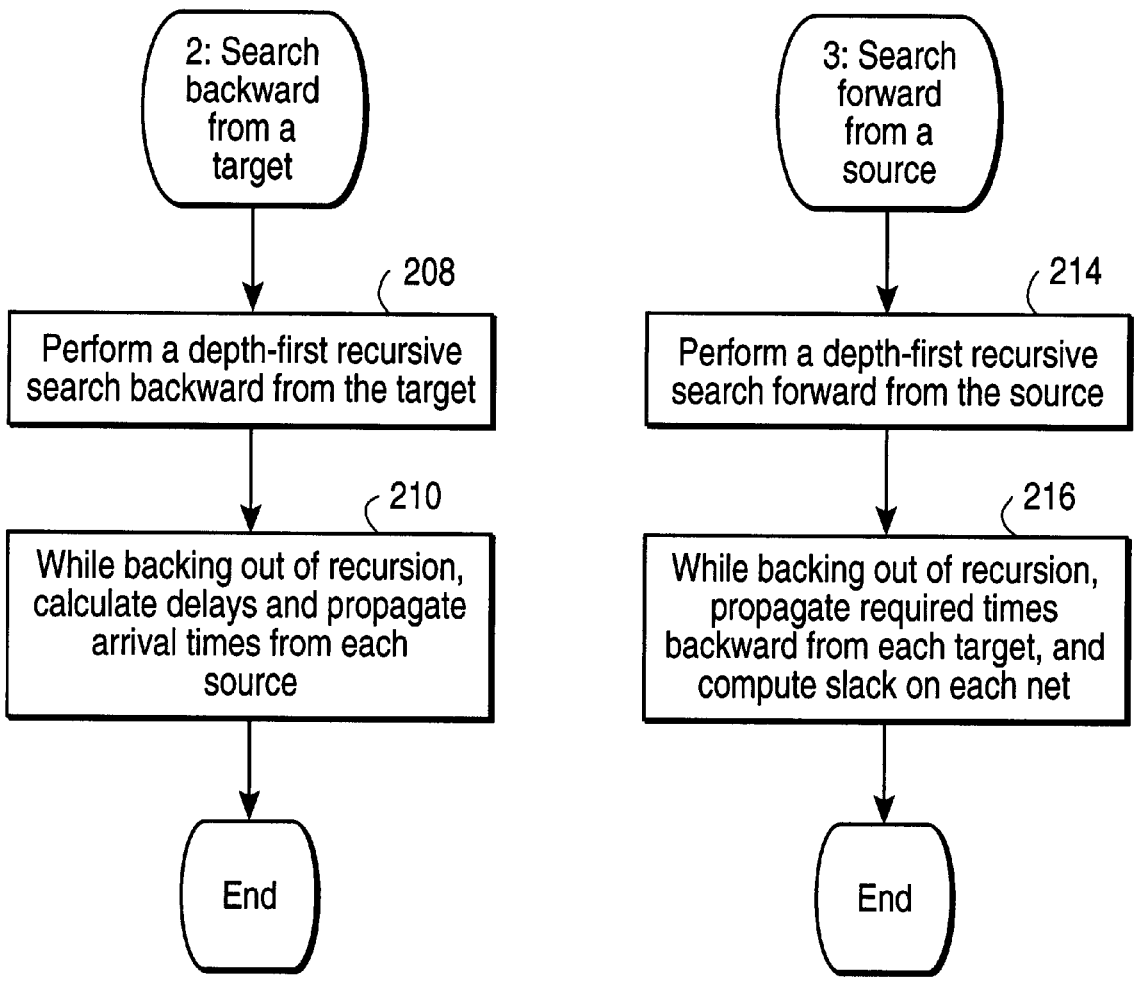

FIGS. 2(a)–(b) are flowcharts illustrating the use of stage-based constraints for timing-driven placement and routing according to a preferred embodiment of the present invention. Each time stage-based constraints are interpreted, the following process is used as described in FIGS. 2(a)–(b).

First, initialize a marker on each pin to zero, and initialize a global slack on each net to a large positive value 200. Then, for each partition, compute slack with respect to that partition 202. In FIG. 2(a) the procedure for computing slack with respect to a partition starts with label 1.

The first step in computing slack for a partition is to increment a count of the partitions 204. Next, for each target in the partition, search backward from the target 206. This process is represented in FIG. 2(b) by the procedure starting at label 2. A recursive depth-first traversal is performed going backward from the target, stopping when a source in the partition is reached 208. Set the arrival time at that source based on the clock edge arrival time (sequential elements), or relative arrival time (primary inputs and combinational sources). Usually, arrival times will exist for both edges, but if one edge is omitted, do not propagate an arrival time for it. While backing out of the recursion from a source in the partition, compute delays using estimated net capacitance and cumulative worst case arrival times 210. Set the marker on each pin to the partition count. Prune the backward search when a source is reached which is not in the partition, or when a pin is encountered which has already been processed for another target in the same partition (i.e., the marker is already set to the current partition number), or at any pin or arc which has been disabled.

After performing the backward search, a forward search is performed 212. The forward search is represented by the procedure in FIG. 2(b) with label 3. For each source in the partition, perform a recursive depth-first traversal going forward 214. Stop when a target in the partition is reached. Set the relative required time at that target based on the clock edge arrival time and the setup/hold time (sequential elements) or the relative required time (primary outputs and combinational targets). Usually, required times will exist for both edges and for both setup and hold checks, but if one edge or timing check is omitted, or if the partition is labeled as not applying to an edge or timing check, do not propagate a required time for it. While backing out of the recursion from a target in the partition, compute relative required times and the slack at each net with respect to the current partition 216. Update the global slack for the net if the local partition slack is smaller. Prune the forward search at any pin whose marker is different than the current partition number, and at any pin or arc which has been disabled. Note that information concerning which pins are disabled can be stored external to the partitions.

After the slack has been computed for each net across all partitions 218, a variation of the zero-slack algorithm (ZSA), as described in references 3, 4, and 5, identified above is used to determine an adjusted capacitance limit for each net 220. ZSA may take several iterations to converge. For each iteration, the slacks are updated by re-evaluating the stage-based constraints, using the current capacitance limit for each net in computing its delay 222.

The final timing reports generated by QPlace do a more detailed delay calculation, and the stage-based constraints are re-evaluated using those delays in order to report the final slack on a net-by-net basis.

Incremental Logic Optimization

Figure 3A:
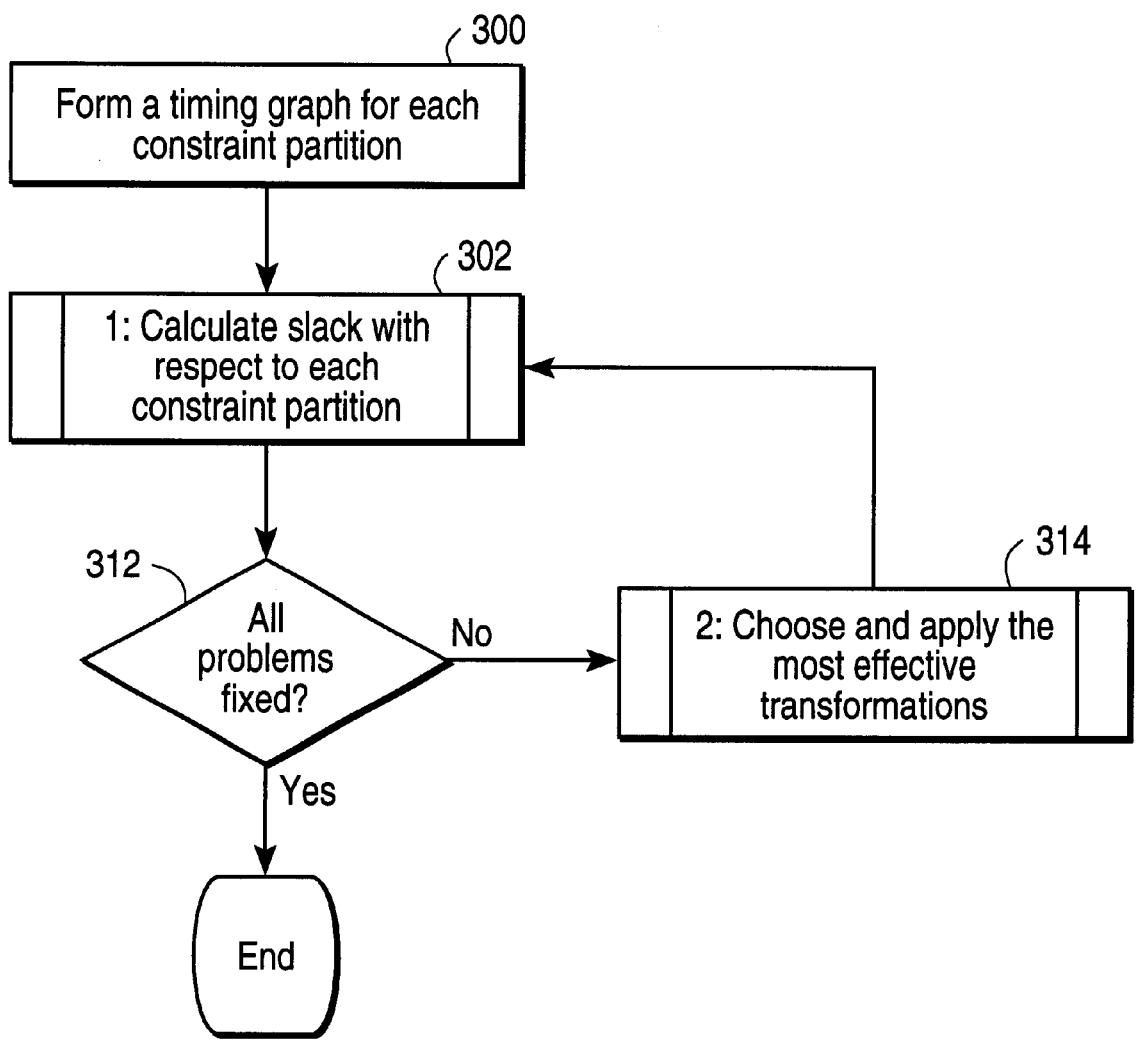
FIGS. 3(a)–(c) are flowcharts illustrating the use of stage-based constraints for incremental logic optimization.
Figure 3B:
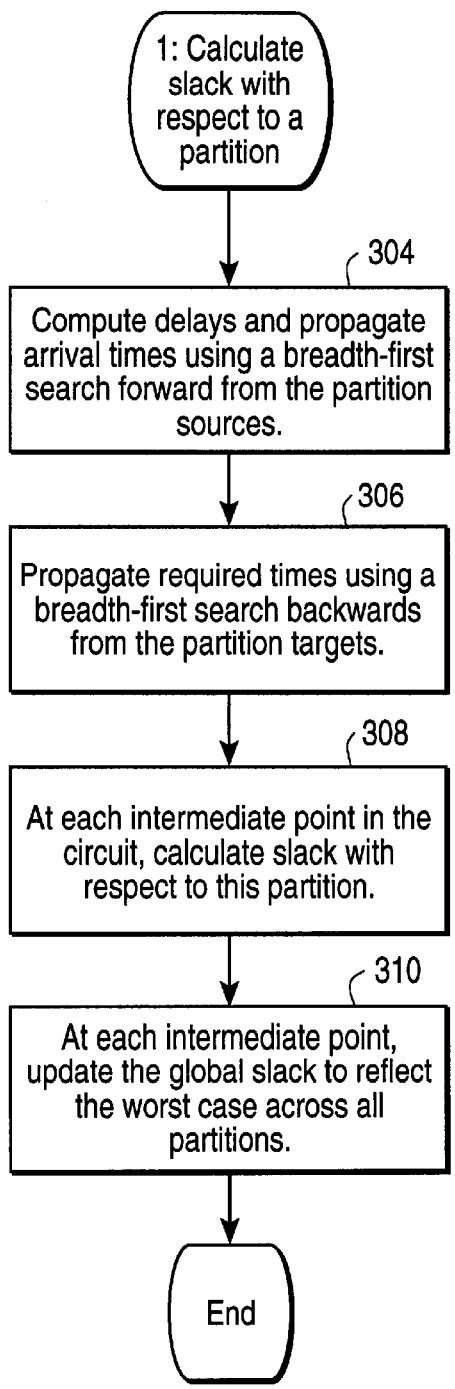
Figure 3C:
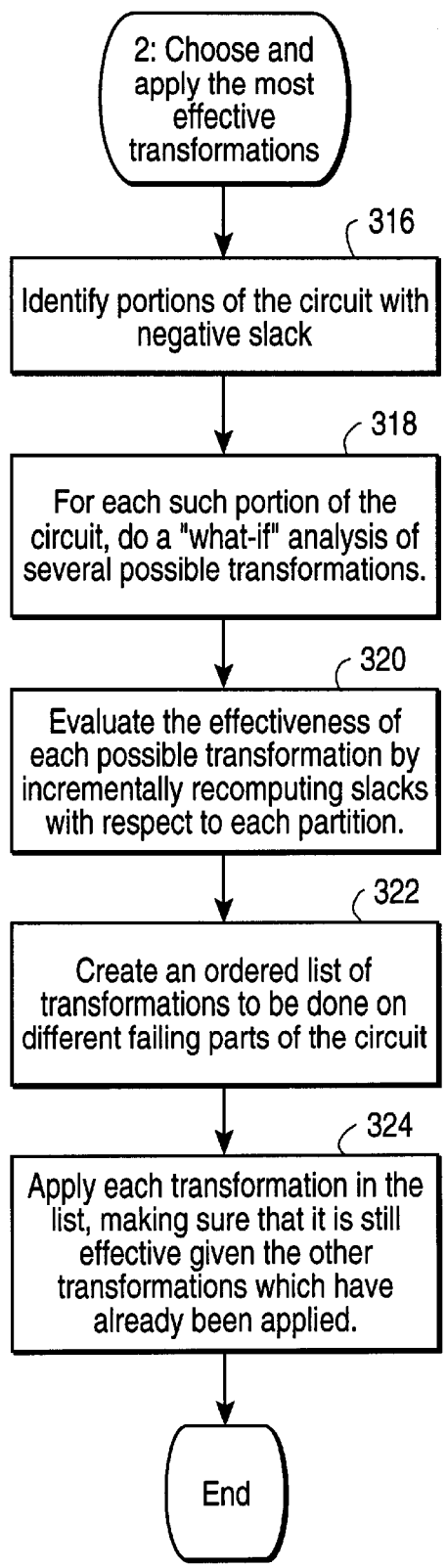

FIGS. 3(a)–(c) are flowcharts illustrating the use of stage-based constraints for incremental logic optimization and is described below with respect to Placement-Based Optimization (PBopt). PBopt performs incremental logic optimization on a circuit after it has been placed. The purpose of this optimization is to resize components and introduce additional buffers where necessary to fix timing violations. It can also be used to reduce the power consumption of a circuit by reducing the size of components in non-critical portions of the design.

In PBopt, the constraint partitions are represented explicitly by constructing a separate timing graph for each partition, where the timing graph only contains arcs which are included in at least one path in the partition 300. This approach allows faster incremental analysis of each affected partition as a component is changed.

Like QPlace, PBopt uses the stage-based constraints to determine slack 302. The slack relative to each constraint partition is computed for each point in the circuit, and the global slack for that point is set to the minimum slack across all partitions.

The stage-based constraint generation process ensures that all times in the partition associated with each graph are directly comparable. Because of this, PBopt starts by using a simple breadth-first traversal going forward from the sources in a graph to compute relative arrival times 304, and another breadth-first traversal going backward from the targets to compute relative required times 306. In the forward (backward) traversal, relative arrival (required) times are not propagated through pins or arcs which are marked as disabled. At each point, the slack relative to that constraint partition is the difference between the relative required time and the relative arrival time.

In the backward traversal, relative required times for a particular edge or timing check are not propagated backward from a target when the labels on the partition indicate that the edge or timing check is disabled for that target. Slacks are computed at intermediate points in the circuit with respect to each edge and each timing check 308, but only when information for that edge and timing check has been propagated both forward and backward to the intermediate point. The slack is not computed or used in cases where information for an edge or timing check has not been propagated in either the forward or backward direction.

At each intermediate point, the global slack is updated to reflect the worst case across all partitions 310. If the global slack indicates that problems remain 312, transformations must be chosen and applied to fix the problems 314.

The procedure for choosing and applying transformations appears in FIG. 3(c) under label 2. The initial slack information is used to rank possible transformations on the circuit in order of anticipated improvement in the slack. Each transformation is evaluated by doing a what-if analysis which incrementally updates the slack for all logic in the transitive fan-in and fan-out of the transformation. The slack is recomputed with respect to each of the partitions affected by the transformation. First, all portions of the circuit with negative slack are identified 316. For each such portion of the circuit, a "what-if" analysis is performed for several possible transformations 318. The effectiveness of each possible transformation is evaluated by incrementally recomputing slacks with respect to each partition 320. Then, an ordered list of transformations is created, based on the effectiveness of each transformation 322.

A transformation might improve one slack (for example, by reducing the component delay) but worsen another slack (for example, by creating a larger input pin capacitance and slowing down an input net).

Because of this, PBopt tries to filter out transformations which are effective in reducing some slacks but produce a worse result overall. In ranking the possible transformations, PBopt examines the overall effect of the transformation on the slack of arcs for several levels of logic connected to the transformed component(s). If the overall effect is that the overall slack decreases or stays the same, the transformation is discarded.

After filtering out ineffective transformations, each remaining transformation is attempted in series until all timing problems have been removed, or until all transformations have been done. Before each transformation is actually tried, a second what-if analysis is done to see whether the transformation is still effective, given that logic around it may have been changed by previous transformations 324.

After all of the possible transformations have been attempted, additional iterations are performed of the entire process, because some new transformations may become effective due to the changes done in the previous iteration. The overall iteration stops when no further transformations are effective.

The results of some experiments using the present invention are set forth below.

Table 1 illustrates the test results for a c_shell design having approximately 6250 components. The test was performed on a Sparc 5 computer having 110 MHz CPU and 128 MB of physical memory.

TABLE 1

|  | Non-Timing Driven | Stage-Based Constraints | Cover Design Constraints |
| --- | --- | --- | --- |
| Constraint File Size (MB) | n/a | 0.16 | 6.9 |
| QPlace Run Time (min:sec) | 16:34 | 18:48 | 33:49 |
| QPlace Memory Usage (MB) | 12.15 | 14.69 | 15.97 |
| Min Cycle Time (ns) | 34.59 | 34.26 | 34.19 |

Table 2 illustrates the test results for a tdsp_core design having approximately 4315 components. The test was performed on a Sparc 10 computer having 36 MHz CPU and 128 MB of physical memory. Both the non-timing driven and stage based constraint results were routable.

TABLE 2

|  | Non-Timing Driven | Stage-Based Constraints | 3-Pin Constraints |
| --- | --- | --- | --- |
| Constraint File Size (MB) | n/a | 0.16 | 2.2 |
| QPlace Run Time | 14 min | 25 min | 8 hr |
| QPlace Memory Usage (MB) | 8.19 | 10.17 | 9.76 |
| Min Cycle Time (ns) | 34.828 | 34.406 | unknown |

There is an anomaly in Table 2, where the memory usage was actually slightly higher for stage-based constraints than for 3-pin constraints. Investigation of this anomaly led to the observation that as arrival and required times are propagated through a portion of the circuit, the data structures to represent them are dynamically allocated (additional memory is obtained as needed, rather than obtained before starting any analysis).

QPlace allocates as much memory as required to represent the propagated arrival and required times for each partition in turn during stage-based constraint analysis, and frees that memory after the analysis of the partition is complete. Similarly, it allocates as much memory as required to represent the propagated arrival and required times for each 3-pin constraint in turn during 3-pin constraint analysis, and frees that memory after the analysis of the 3-pin constraint is complete.

In general, each partition in stage-based constraints will describe a larger portion of the circuit than each 3-pin constraint. Therefore, the number of propagated arrival and required times (and the memory required to represent them) will be somewhat larger for the stage-based constraints than for 3-pin constraints. For larger circuits, this is offset by the much larger number of 3-pin constraints, where storing the constraints themselves will take more memory.

Table 3 illustrates the test results for Missouri, which is a fairly large test case with about 75,000 cell instances. The results on this test case clearly show that the performance advantages of stage-based constraints become more significant as the design size increases, while providing the same or better quality of results.

In addition, it demonstrates that the performance overhead of using stage-based constraints for timing-driven placement is minimal relative to doing non-timing-driven placement. There is only a 20% overhead in doing timing-driven placement using stage-based constraints, where there is an 80% overhead in doing it with cover design constraints.

TABLE 3

|  | Non-Timing Driven | Stage-Based Constraints | Cover Design Constraints |
| --- | --- | --- | --- |
| Constraint File Size (MB) | n/a | 3.25 | 97.07 |
| QPlace Run Time (hr:min) | 1:53 | 2:20 | 3:31 |
| QPlace Memory Usage (MB) | 114 | 124 | 143 |
| Min Cycle Time (ns) | 20.4 | 19.35 | 19.35 |

The above description is included to illustrate the operation of exemplary embodiments and is not meant to limit the scope of the invention. The scope of the invention is to be limited only by the following claims. From the above description, many variations will be apparent to one skilled in the art that would yet be encompassed by the spirit and scope of the present invention. For example, it is possible to specify multi-cycle paths by indicating offsets for pins which are always part of multi-cycle paths. These offsets amount to negative delays, and are interpreted during the expansion of each constraint partition. By specifying multi-cycle paths in this way, it is not necessary that all targets in a multi-cycle partition require a common number of cycles. Also, the $SBC_1$ and $SBC_2$ formulations could be target clock based, rather than source clock based. In such a formulation, all targets (rather than all sources) in a partition would be triggered by a common root clock edge.

We claim:

1. A computer-readable medium containing a specification of timing constraints for an integrated circuit design which contains sources, targets, and paths, the specification comprising:

a set of partitions specifying timing constraints, each partition divided into two stages, a first stage including at least one source and a second stage including at least one target, each source being connected to at least one target in the same partition by at least one path, each target being connected to at least one source in the same partition by at least one path, and the set of partitions being organized such that, for every path in the design, exactly one partition from the set of partitions includes the source and the target which are connected by that path.

2. The computer-readable medium of claim 1, wherein, for each partition in the set of partitions, all of the sources of that partition are triggered by a common clock edge.

3. The computer-readable medium of claim 2, wherein, for each partition in the set of partitions, all of the targets of that partition are triggered by a common clock edge.

4. The computer-readable medium of claim 1, wherein, for each partition in the set of partitions, all of the targets of that partition are triggered by a common clock edge.

5. The computer-readable medium of claim 1, wherein at least one of the partitions corresponds to a combinational constraint.

6. The computer-readable medium of claim 1, wherein at least one of the partitions corresponds to a multi-cycle constraint, with the required departure times of the targets in the partition being set to account for the multi-cycle constraint.

7. The computer-readable medium of claim 1, wherein at least one of the partitions corresponds to a multi-cycle constraint, with the arrival times of the sources in the partition being set to account for the multi-cycle constraint.

8. The computer-readable medium of claim 1, wherein at least one partition in the set includes more than one source.

9. The computer-readable medium of claim 8, wherein, for each partition in the set of partitions, all of the sources of that partition are triggered by a common clock edge.

10. The computer-readable medium of claim 8, wherein, for each partition in the set of partitions, all of the targets of that partition are triggered by a common clock edge.

11. The computer-readable medium of claim 10, wherein, for each partition in the set of partitions, all of the sources of that partition are triggered by a common clock edge.

12. The computer-readable medium of claim 8, wherein at least one of the partitions corresponds to a combinational constraint.

13. The computer-readable medium of claim 8, wherein at least one of the partitions corresponds to a multi-cycle constraint, with the required departure times of the targets in the partition being set to account for the multi-cycle constraint.

14. The computer-readable medium of claim 1, wherein at least one partition in the set includes more than one target.

15. A method of generating partitions specifying timing constraints for an integrated circuit design which contains sources, targets, and paths, the method comprising the steps of:
   determining all source-target pairs in the design for which the source and the target of the pair are both subject to timing constraints, and for which there is at least one path in the design connecting the source and the target; and
   grouping sources and targets of the source-target pairs into partitions which specify timing constraints, each partition including a set of sources and a set of targets, and the partitions being formed such that, for each source-target pair, exactly one of said partitions includes both the source of the source-target pair and the target of the source-target pair, and such that each partition includes all the paths which start at one of its set of sources or end at one of its set of targets.

16. The method of claim 15, wherein for each partition, all sources of that partition are triggered by a common clock edge.

17. The method of claim 15, wherein for each partition, all targets of that partition are triggered by a common clock edge.

18. The method of claim 17, wherein for each partition, all sources of that partition are triggered by a common clock edge.

19. The method of claim 15 further comprising the steps of:
   responsive to there being at least one combinational delay constraint specifying at least one source and at least one target, for each combinational delay constraint:
   creating a combinational delay constraint partition; and
   including in the combinational delay constraint partition the sources and paths specified by the combinational constraint.

20. The method of claim 15, further comprising the steps of:
   responsive to there being at least one multi-cycle path specification, for each multi-cycle path specification:
   extracting sources of that multi-cycle path specification from the partitions;
   for each extracted source, creating a new multi-cycle partition; and
   including in each multi-cycle partition one of the extracted sources and all targets which are connected to the included extracted source.

21. The method of claim 20, further comprising the step of setting the required departure time of each target to account for the multi-cycle specification.

22. The method of claim 21, wherein for each multi-cycle partition, all targets of the multi-cycle partition require a common number of cycles.

23. The method of claim 15, further comprising the steps of:
   responsive to there being at least one multi-cycle path specification, for each multi-cycle path specification:
   extracting targets of that multi-cycle path specification from the partitions;
   for each extracted target, creating a new multi-cycle partition; and
   including in each multi-cycle partition one of the extracted targets and all sources which are connected to the included extracted target.

24. The method of claim 23, further comprising the step of setting the arrival time of each source to account for the multi-cycle specification.

25. The method of claim 23, wherein for each multi-cycle partition, all sources of the multi-cycle partition require a common number of cycles.

26. The method of claim 15, further comprising the steps of:
   responsive to there being at least one false path specification, for each false path specification:
   extracting the sources of that false path specification from the partitions;
   for each extracted source, creating a false path partition; and
   including in each of the false path partitions one of the extracted sources and all targets which are connected to the included extracted source by non-false paths.

27. The method of claim 26, wherein for each partition, all targets of the partition require a common number of cycles.

28. The method of claim 15, further comprising the steps of:
   responsive to there being at least one false path specification, for each false path specification:
   extracting the targets of that false path specification from the partitions;
   for each extracted target, creating a false path partition; and
   including in each of the false path partitions one of the extracted targets and all sources which are connected to the included extracted target by non-false paths.

29. The method of claim 28, wherein for each partition, all sources of the partition require a common number of cycles.

30. The method of claim 15, further comprising the step of:
   responsive to there being at least one pair of partitions in which the sources of both partitions are triggered by the same clock edge and in which there is no path from any of the sources in either partition to any of the targets in the other partition, combining the partitions.

31. The method of claim 15, further comprising the step of:
   responsive to there being at least one pair of partitions in which the targets of both partitions are triggered by the same clock edge and in which there is no path from any of the sources in either partition to any of the targets in the other partition, combining the partitions.

32. A computer-implemented method of using a set of partitions, which specify timing constraints, for determining slack in an integrated circuit design, each partition of the set divided into two stages including a first stage comprising at least one source and a second stage comprising at least one target, each source in each partition being connected to at least one target in the partition by at least one path, each target in each partition being connected to at least one source in the partition by at least one path, the method comprising the steps of:

for each partition of the set:

for each source of the partition, determining an arrival time;

from the arrival times determined for the sources, computing arrival times along paths of the partition;

for each target of the partition, determining a required departure time;

from the determined required departure times, computing required departure times along paths of the partition; and from the computed required departure times and the computed arrival times, computing slack along paths included in the partition;

wherein the set of partitions is organized such that, for every path in the integrated circuit designs exactly one partition from the set of partitions includes the source and the target which are connected by that path.

33. The method of claim 32, wherein arrival times are not computed for paths which include a pin which is disabled.

34. The method of claim 32, wherein required departure times are not computed for paths which include a pin which is disabled.

35. The method of claim 32, wherein the step of computing arrival times along paths of the partition takes into account multi-cycle offsets associated with any pins in the paths.

36. The method of claim 32, wherein the step of computing required departure times along paths of the partition takes into account multi-cycle offsets associated with any pins in the paths.

37. The method of claim 32, wherein for each partition, all of the sources included in the partition are triggered by a common clock edge.

38. The method of claim 32, wherein for each partition, all of the targets included in the partition are triggered by a common clock edge.

39. The method of claim 32, wherein at least one partition in the set includes more than one source.

40. The method of claim 32, wherein at least one partition in the set includes more than one target.

41. A computer-readable medium containing a specification of timing constraints for an integrated circuit design which contains sources, targets, and paths between the sources and targets, the specification comprising:

a set of partitions for an integrated circuit design, said partitions specifying timing constraints for the integrated circuit design, each partition being divided into two stages, a first stage including one or more sources and a second stage including one or more targets;

wherein each source is associated with an arrival time of a specific clock edge which triggers that source, and each target is associated with a required departure time for a specific clock edge which triggers that target;

wherein the set of partitions is organized such that for every path in the design, exactly one partition from the set of partitions includes the source and the target which are connected by that path; and wherein each partition includes all the paths which start at one of the sources in the partition's first stage or end at one of the targets in the partition's second stage.

42. The computer-readable medium of claim 41, wherein the sources comprise both sequential and combinational sources and the targets comprise both sequential and combinational targets.

43. The computer-readable medium of claim 42, wherein each sequential source comprises either a clock edge arrival time and an arc from a clock pin to a data output pin on a sequential element, or a relative arrival time and a primary input; and each sequential target comprises either a clock edge arrival time and an arc from a data input pin to a clock pin on a sequential element, or a relative required time and a primary output.

44. The computer-readable medium of claim 43, wherein primary inputs are specified as sequential sources;

primary outputs are specified as sequential targets; and multiple arrival times for a primary input or multiple departure times for a primary output are separated into different partitions.

45. The computer-readable medium of claim 41, wherein, within each partition, all times are a known offset from a common reference point.

46. The computer-readable medium of claim 41, wherein, for each partition in the set of partitions, all of the sources of that partition are triggered by a first common clock edge, and all of the targets of that partition are triggered by a second common clock edge.

47. The computer-readable medium of claim 41, wherein, for each partition in the set of partitions, all of the sources of that partition are triggered by a first common clock edge, and, for at least one partition in the set of partitions, the targets of that partition are triggered by two or more different clock edges.

48. The computer-readable medium of claim 41, wherein said integrated circuit design comprises a logical clock distribution network.

49. The computer-readable medium of claim 41, wherein said integrated circuit design comprises a physical clock distribution network.

50. The computer-readable medium of claim 41, wherein a first path and a second path in different partitions include a common gate of the integrated circuit design.

* * * * *